US008557616B2

(12) United States Patent
Lau et al.

(10) Patent No.: US 8,557,616 B2
(45) Date of Patent: Oct. 15, 2013

(54) METHOD FOR MANUFACTURING A MONOLITHIC LED MICRO-DISPLAY ON AN ACTIVE MATRIX PANEL USING FLIP-CHIP TECHNOLOGY AND DISPLAY APPARATUS HAVING THE MONOLITHIC LED MICRO-DISPLAY

(75) Inventors: Kei May Lau, Hong Kong (CN); Chi Wing Keung, Hong Kong (CN); Zhaojun Liu, Hong Kong (CN)

(73) Assignee: Nano and Advanced Materials Institute Limited, Hong Kong (CH)

( * ) Notice: Subject to any disclaimer, the term of this patent is extended or adjusted under 35 U.S.C. 154(b) by 139 days.

(21) Appl. No.: 13/130,442

(22) PCT Filed: Jun. 1, 2010

(86) PCT No.: PCT/US2010/036900
§ 371 (c)(1),
(2), (4) Date: May 20, 2011

(87) PCT Pub. No.: WO2011/071559
PCT Pub. Date: Jun. 16, 2011

(65) Prior Publication Data
US 2011/0309378 A1     Dec. 22, 2011

Related U.S. Application Data

(60) Provisional application No. 61/267,894, filed on Dec. 9, 2009.

(51) Int. Cl.
*H01L 21/00*     (2006.01)
(52) U.S. Cl.
USPC ................................. 438/28; 257/E21.499

(58) Field of Classification Search
USPC ................................................. 438/35, 604
See application file for complete search history.

(56) References Cited

U.S. PATENT DOCUMENTS

| | | | |
|---|---|---|---|
| 5,859,474 A | 1/1999 | Dordi | |
| 7,169,652 B2 * | 1/2007 | Kimura | 438/149 |
| 7,268,416 B2 * | 9/2007 | Furihata | 257/678 |
| 7,354,846 B2 | 4/2008 | Kim et al. | |
| 2002/0005819 A1 | 1/2002 | Ronzani et al. | |
| 2008/0310005 A1 | 12/2008 | Tonar et al. | |

* cited by examiner

*Primary Examiner* — Chandra Chaudhari
(74) *Attorney, Agent, or Firm* — Nath, Goldberg & Meyer; Jerald L. Meyer; Stanley N. Protigal

(57) ABSTRACT

A high-resolution, Active Matrix (AM) programmed monolithic Light Emitting Diode (LED) micro-array is fabricated using flip-chip technology. The fabrication process includes fabrications of an LED micro-array and an AM panel, and combining the resulting LED micro-array and AM panel using the flip-chip technology. The LED micro-array is grown and fabricated on a sapphire substrate and the AM panel can be fabricated using CMOS process. LED pixels in a same row share a common N-bus line that is connected to the ground of AM panel while p-electrodes of the LED pixels are electrically separated such that each p-electrode is independently connected to an output of drive circuits mounted on the AM panel. The LED micro-array is flip-chip bonded to the AM panel so that the AM panel controls the LED pixels individually and the LED pixels exhibit excellent emission uniformity. According to this constitution, incompatibility between the LED process and the CMOS process can be eliminated.

17 Claims, 8 Drawing Sheets

METHOD FOR MANUFACTURING A MONOLITHIC LED MICRO-DISPLAY ON AN ACTIVE MATRIX PANEL USING FLIP-CHIP TECHNOLOGY AND DISPLAY APPARATUS HAVING THE MONOLITHIC LED MICRO-DISPLAY

BACKGROUND OF THE INVENTION

1. Field of the Invention

The present subject matter relates generally to manufacturing a Light Emitting Diode (LED) micro-display on an Active Matrix (AM) panel, and more specifically to manufacturing an LED micro-display on an AM panel using flip-chip technology.

2. Related Art

LED array displays made with individually packaged devices have been widely used for various applications. In recent years, different techniques have been exploited to fabricate monolithic, passively-addressable LED arrays. The array dimensions and pixel brightness in conventional passively-addressable LED arrays were limited by the loading effect in the same row or column. Thus, various new address schemes and fabrication technologies are suggested to improve the operating effectiveness of monolithic LED arrays.

For example, U.S. Pat. Nos. 5,789,766, 5,827,753, and 5,893,721 relate to methods of fabricating an LED array and driving circuitry that includes sequentially forming overlying layers of material on the surface of a semiconductor substrate, the layers cooperating to emit light when activated. The insulating layer is formed on the layers and the layers are isolated into an array area and the driver circuitry area with row and column drivers dividing the array area into an array of LEDs arranged in rows and columns. Row and column driver circuits are formed on the insulating layer in the driver circuitry area. Row buses individually couple each LED in the array to corresponding driver circuits. But the circuitry layer formed on the insulating layer can only be a thin film device like a-Si TFT or poly-Si TFT, however, these have low field effect mobility and cannot provide enough current for the LEDs. On the other hand, these three patents adopt a bottom-emitting configuration and the aperture of the array is limited by the circuitry area, thereby resulting in a relatively low light efficiency.

U.S. Patent Application Publication No. 2008/0194054 relates to a method of fabricating an LED array package structure having a silicon substrate. The LED array package structure includes a silicon substrate having a plurality of cup-structures thereon, a reflective layer disposed on the silicon substrate, a transparent insulation layer disposed on the reflective layer, a conductive layer disposed on the transparent insulation layer and a plurality of LEDs disposed respectively on the conductive layer in each cup-structure. In this way, the LED array can only operate in a passive mode and each LED size is as large as tens millimeters. Hence, the LEDs made by this method often suffer from bad illumination uniformity and the low resolution.

U.S. Pat. No. 6,975,293 relates to five types of driving circuits for an active matrix LED display. The circuits are composed of four MOS transistors, each of which has a drain and a source. An anode of an LED is coupled to a source of a driving transistor and a cathode of the LED is coupled to a second voltage. These methods are suitable for an OLED array display, but not suitable for an LED micro-display array because the LED process is not compatible with the CMOS process.

U.S. Patent Application Publication No. 2008/0171141 relates to methods of fabricating LED array structures including multiple vertical LED stacks coupled to a single metal substrate. Such an LED array may offer better heat conduction and an improved matching of LED characteristics (e.g., forward voltage and emission wave length) between the individual LED stacks compared to conventional LED arrays. But the LED array in this reference can only act as a single LED which can only light on and off together and cannot control the LED pixel individually and precisely.

SUMMARY OF THE INVENTION

The present subject matter provides a method for manufacturing a monolithic LED micro-display on an active matrix panel using flip-chip technology and a display apparatus having the monolithic LED micro-display.

According to an aspect, the subject matter is directed to a method for manufacturing a monolithic Light Emitting Diode (LED) micro-display panel on an Active Matrix (AM) panel, comprising: providing a substrate of the LED micro-display panel; providing a plurality of overlaying layers of material on a surface of the substrate, the plurality of overlaying layers of material being configured in combination to emit light when activated; patterning the plurality of overlaying layers of material by removing a part thereof all the way down to the surface of the substrate; depositing a current spreading layer on the plurality of overlaying layers of material and the surface of the substrate; providing a metal multilayer on the patterned plurality of overlaying layers of material and the surface of the substrate; patterning the metal multilayer in such a configuration that a first portion of the metal multilayer, which lies on the patterned plurality of overlaying layers of material, and a second portion of the metal multilayer, which lies on the surface of the substrate are conductively disconnected, thereby forming an micro-array of multiple monolithic LEDs; and combining the monolithic LED micro-display panel with the AM panel, which includes a plurality of active control circuit chips fixed thereon, the plurality of active control circuit chips being provided with conductive solder material thereon, in such a configuration that the monolithic LEDs are flip-chip bonded to the active control circuit chips via the conductive solder material and each of the monolithic LEDs is electrically insulated from one another, whereby each of the monolithic LEDs is independently controllable by corresponding one of the active control circuit chips bonded thereto.

According to another aspect, the subject matter is directed to a method for manufacturing an assembly of a monolithic Light Emitting Diode (LED) micro-display panel including a plurality of LEDs thereon and an Active Matrix (AM) panel, comprising: providing a substrate of the AM panel; providing active control circuit chips on the substrate of the AM panel; providing conductive solder material on the active control circuit chips; and combining the AM panel with the monolithic LED micro-display panel in such a configuration that the active control circuit chips are flip-chip bonded to the plurality of monolithic LEDs via the conductive solder material.

According to a further aspect, the subject matter is directed to a Light Emitting Diode (LED) display comprising: a LED panel mounted with a plurality of LEDs arranged in rows and columns; and an Active Matrix (AM) panel mounted with a plurality of active control circuits, wherein the LED panel is combined with the AM panel in such a configuration that each of the plurality of LEDs is associated with each of the active control circuits, each pair of an LED and an associated active control circuit being electrically insulated from other pairs of LEDs and associated active control circuits in the LED display, each LED being independently controllable by each associated active control circuit.

BRIEF DESCRIPTION OF THE DRAWINGS

These and other aspects of the subject matter will be apparent with reference to the examples in the following description and with reference to the accompanying drawings, wherein.

DETAILED DESCRIPTION OF THE INVENTION

Figure 1:
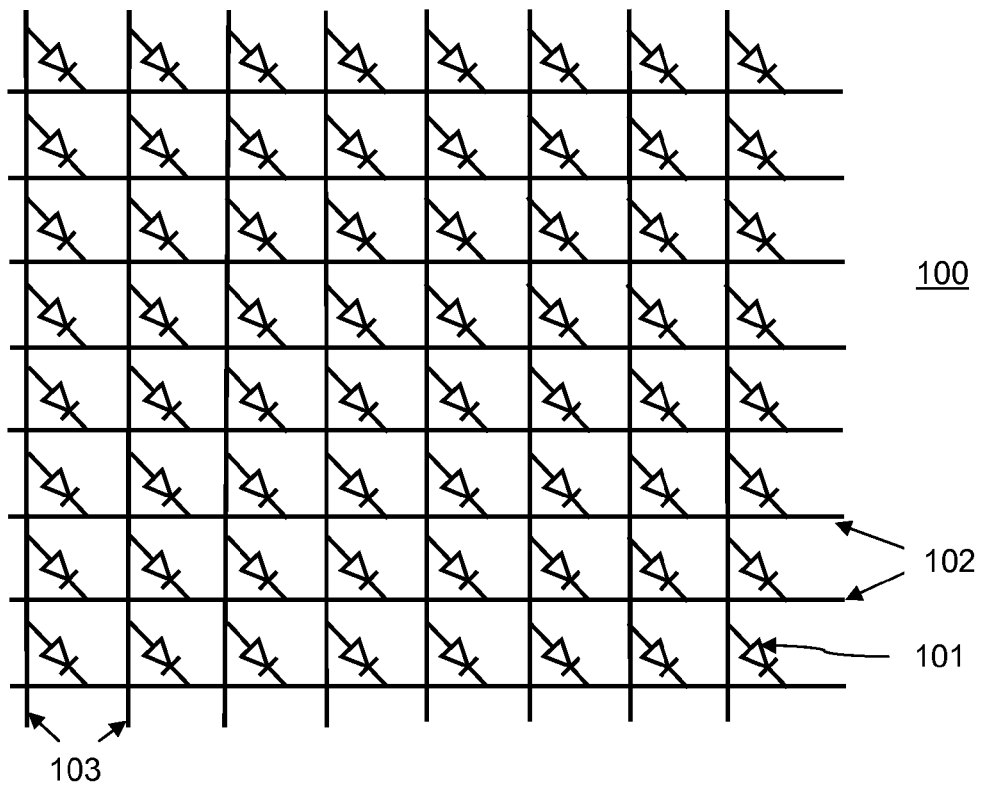
FIG. 1 is a simplified prior art schematic diagram of a top plan view of a passive LED matrix wherein the passive LED matrix includes a plurality of LEDs arranged in rows and columns with anodes in a same column connected to one another via column buses and cathodes in a same column connected to one another via row buses.

The Figures are diagrammatic and not drawn to scale. In the Figures, elements which correspond to elements already described have the same reference numerals.

Figure 2:
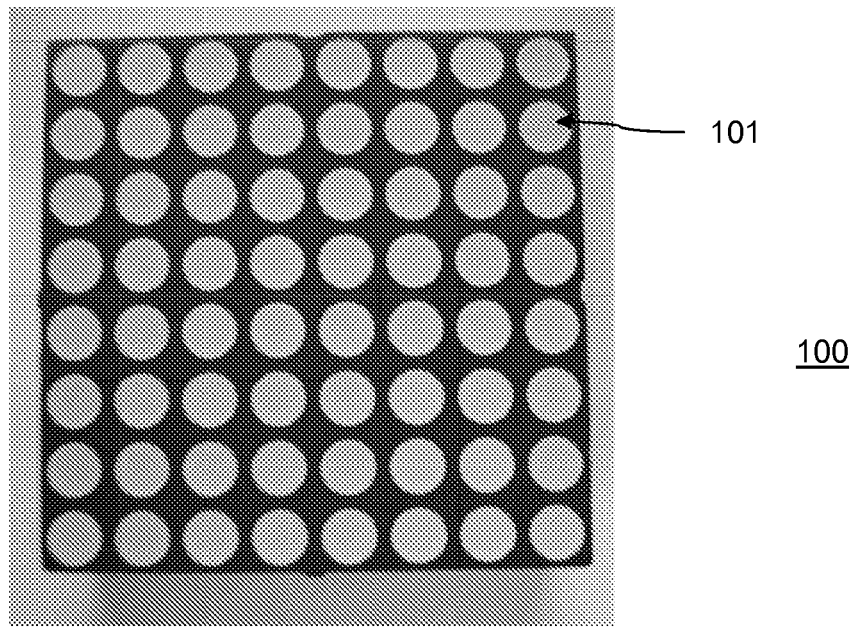
FIG. 2 shows a top plan view of the prior art passive LED matrix, as schematically shown in FIG. 1.

FIG. 1 is a simplified schematic diagram of a top plan view of a prior art passive LED matrix 100 wherein the passive LED matrix 100 includes a plurality of LEDs 101 arranged in rows and columns with anodes in a same column connected to one another via column buses 102 and cathodes in a same column connected to one another via row buses 103. FIG. 2 shows a top plan view of the prior art passive LED matrix, as schematically shown in FIG. 1.

Figure 3:
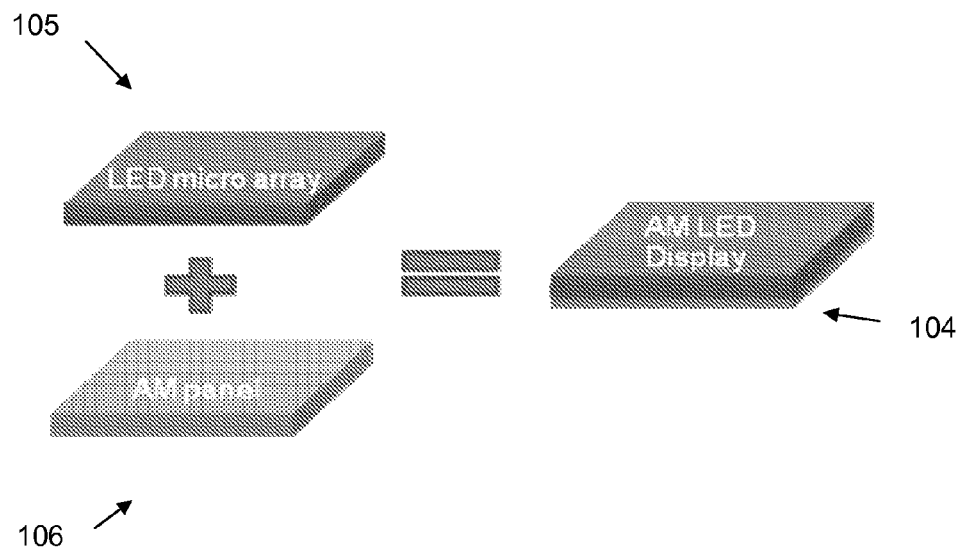
FIG. 3 schematically shows a manufacture of an AM LED display according to the present subject matter by conductive bonding an LED micro-array panel with an AM panel.

FIG. 3 schematically shows a manufacture of an AM LED display 104 according to the present subject matter by flip-chip boding an LED micro-array panel 105 with an AM panel 106. The flip-chip bonding is a method for interconnecting semiconductor devices, such as Integrated Circuit (IC) chips and micro-electromechanical systems, to external circuitry with solder bumps that have been deposited onto the chip pads. The solder bumps are deposited on the chip pads on the top side of the wafer during the final wafer processing step. In order to mount the chip to external circuitry, it is flipped over so that its top side faces down, and aligned so that its pads align with matching pads on the external circuit, and then the solder is flowed to complete the interconnect. In this embodiment, a plurality of active control circuits mounted on the AM panel 104 are flipped over so that their top sides face down, and aligned and coherently adhered to bonding pads of corresponding LEDs mounted on the LED micro-array panel 105. This procedure will be described in more detail below with reference to FIG. 5.

Figure 4:
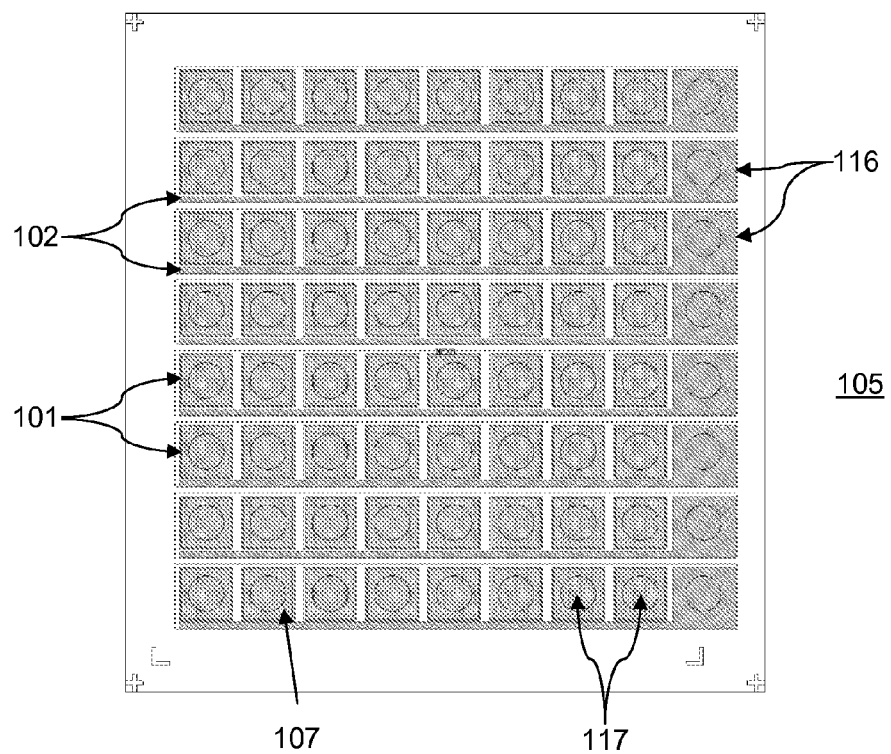
FIG. 4 schematically shows a layout of an 8×8 LED micro-array according to the present subject matter wherein individual LEDs on a same column are connected to one another by their n-electrodes at the end of each row as cathodes while individual LEDs on a same row are connected to an output of an AM panel through the solder bumps as anodes.

FIG. 4 schematically shows a layout of an 8×8 LED micro-array 105 according to the present subject matter wherein individual LEDs 101 (emission wavelength 440 nm) on a same column are connected to one another by their n-electrodes (not shown) via a bus 102 at the end of each row as cathodes 116 while individual LEDs 101 on a same row are connected to an output of an AM panel through the solder bumps as anodes 117. In this constitution, the current passes through an n-GaN layer and an n-metal bus line to reach the n-electrodes. The LED micro-array has similar electrical properties as a commercial 8×8 LED dot array. As shown by commercial discrete power LED manufacturing, flip-chip technology can improve heat dissipation, reliability, and manufacturability. A silicon substrate has a larger thermal conductivity (150 W/m·K) than a sapphire substrate (46 W/m·K), and well-developed flip-chip technology has been used with silicon for decades. In the epi-down (bottom-emitting) configuration, the p-electrode itself can be made reflective, thus eliminating any absorption of the current spreading layer and metal pads. In this way, the light output power and efficiency will be improved.

Figure 5:
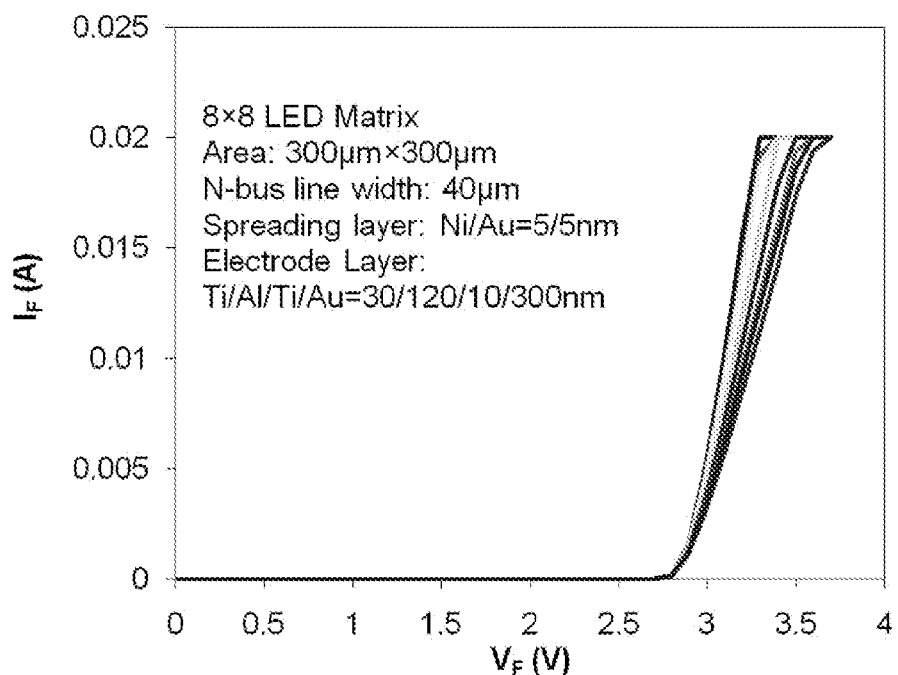
FIG. 5 shows a turn-on voltage distribution of eight LEDs in the same row according to the present subject matter.

FIG. 5 shows a turn-on voltage distribution of eight LEDs in the same row according to the present subject matter. The turn-on voltages of LEDs, under the same 20 mA current injection, were strongly dependent on the distance between each LED and n-electrode. Series resistance of the bus bars to the n-GaN contact strip resulted in increased turn-on voltage with longer distance of dies from the contacts at the end of each column. For high-performance micro-displays, the variation of turn-on voltage might cause a different junction temperature and/or a compensation of piezoelectric field between the individual LED pixels, and hence, a variation in lifetime and emitting wavelength of the individual LEDs. The wavelength variation across the LEDs would result in a poor angular homogeneity of color purity. In this embodiment, the turn-on voltage uniformity was greatly improved in a design with 40 μm-wide one-side n-metal bus lines on each row. The turn-on voltages varied only from 3.30 to 3.70 V over the whole row under the same current injection, as shown in FIG. 5.

Figure 6:
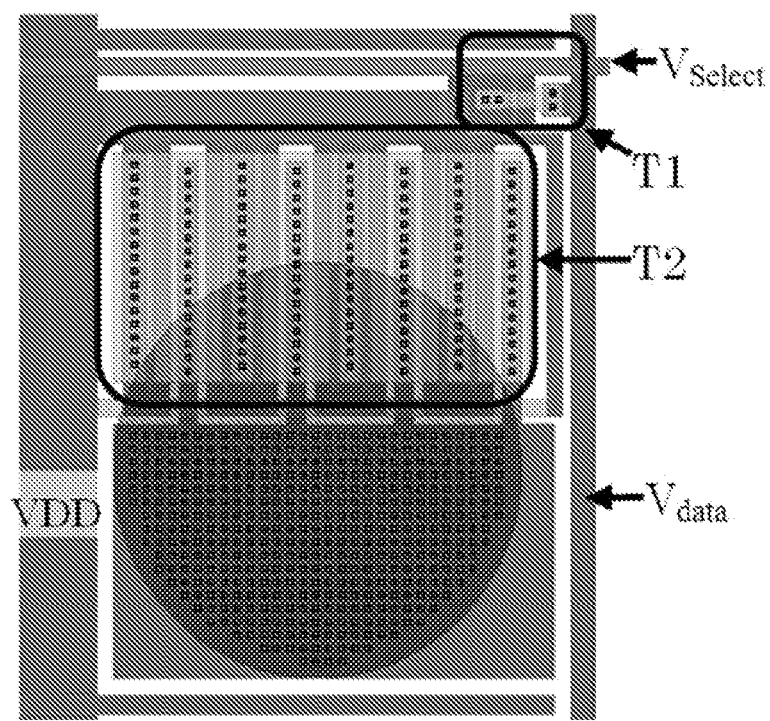
FIG. 6 schematically shows a configuration of driving circuitry on an AM panel according to the present subject matter.

FIG. 6 schematically shows a configuration of driving circuitry on an AM panel according to the present subject matter. Transistor T1 serves as a switching transistor and T2 serves as a driving transistor. When T1 is switched on by a scan signal, a data signal switches T2 on and is stored in the capacitor C1. Then, T2 provides current light up the LED pixel whose p-electrode is connected to the drain of T2. Driving transistor T2 is designed with a large W/L ratio to warrant enough output current for the LED pixel.

Figure 7:
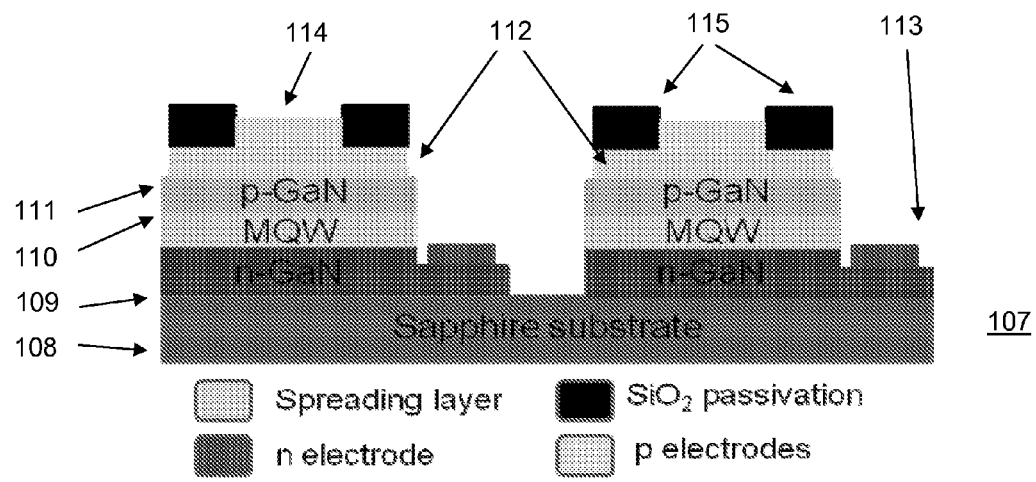
FIG. 7 shows a cross-sectional diagram of two neighboring LED pixels in an LED micro-array as shown in FIG. 4.

FIG. 7 shows a cross-sectional diagram of two neighbored LED pixels 107 shown in FIG. 4 in an LED micro-array according to the present subject matter. An n-GaN layer 109, a Multiple Quantum Well (MQW) 110, and a p-GaN layer 111 were grown on a substrate 108. Silicon dioxide ($SiO_2$) masks were used for inductively coupled plasma (ICP) etching. The LED wafer was etched all the way down to the substrate. Rows of the micro-array were defined and isolated in this step. A Plasma-Enhanced Chemical Vapor Deposition (PECVD) $SiO_2$ mask and an ICP were used again to define the mesa structure of each LED pixel. A thin Ni/Au (5/5 nm) current spreading layer 112 was deposited onto the p-GaN layer 111 to form p-electrodes. Annealing in the atmospheric ambient at 570° C. for 5 minutes was performed. Then, a metal layer 113 was evaporated to form n-electrodes and a reflective layer on the p-electrodes simultaneously. Finally, Silicon dioxide passivation 114 was applied onto the wafer. Openings in the $SiO_2$ layers were defined for flip-chip bonding. The fabrication of an AM LED micro-array display will be described in greater detail below.

First, fabrication of an LED micro-array panel is being described. A standard Multiple Quantum Well (MQW) blue LED wafer (emission wavelength 440 nm) grown on a sapphire substrate was used for fabrication of an LED micro-array. In place of the sapphire substrate, GaAs, SiC, Semi-insulating GaAs, or Quartz substrate can be used. Plasma Enhanced Chemical Vapor Deposition (PECVD) grown $SiO_2$ masks were used for ICP etching. The LED wafer was etched all the way down to the sapphire substrate. Rows of the array were defined and isolated in this step. The PECVD $SiO_2$ mask and ICP were again used to define the mesa structure of each LED pixel, with individual device size of 300×300 μm². A thin Ni/Au (5/5 nm) current spreading layer was deposited onto a p-GaN surface by electron beam evaporation to form p-electrodes. Annealing at 570° C. in ambient atmosphere for 5 minutes was performed. In place of the thin Ni/Au current spreading layer, a thin Ag/ITO current spreading layer can be used. Then, a Ti/Al/Ti/Au (30/120/10/30 nm) multilayer metal was evaporated to form n-electrodes and a reflective layer on the p-electrodes simultaneously. Finally, $SiO_2$ passivation (or $SiN_x$ or photoresist) was applied onto the wafer. Openings in the $SiO_2$ were defined, and a Ni/Au (500/30 nm) contact pad was formed in the opening for flip-chip bonding.

Secondly, fabrication of an AM panel is being described. The AM panel was fabricated with standard Complementary Metal-Oxide Semiconductor (CMOS) process on a (100) single crystal silicon wafer. After cleaning, well regions and body connections were deposited and patterned. Field oxidation was performed to define the active area of the transistors using silicon nitride as a hard mask. Then, a thin layer of thermal oxide was grown as gate oxide. After poly-Si deposition and gate patterning, a source/drain region was formed by ion implantation with standard self-alignment technology. Then, low temperature oxide (LTO) was deposited, and the wafer was annealed to densify the LTO and to activate the implanted dopants simultaneously. After opening contact holes on the LTO layer, Al—Si alloy was deposited, and patterned for source/drain electrodes and interconnections.

Figure 10:
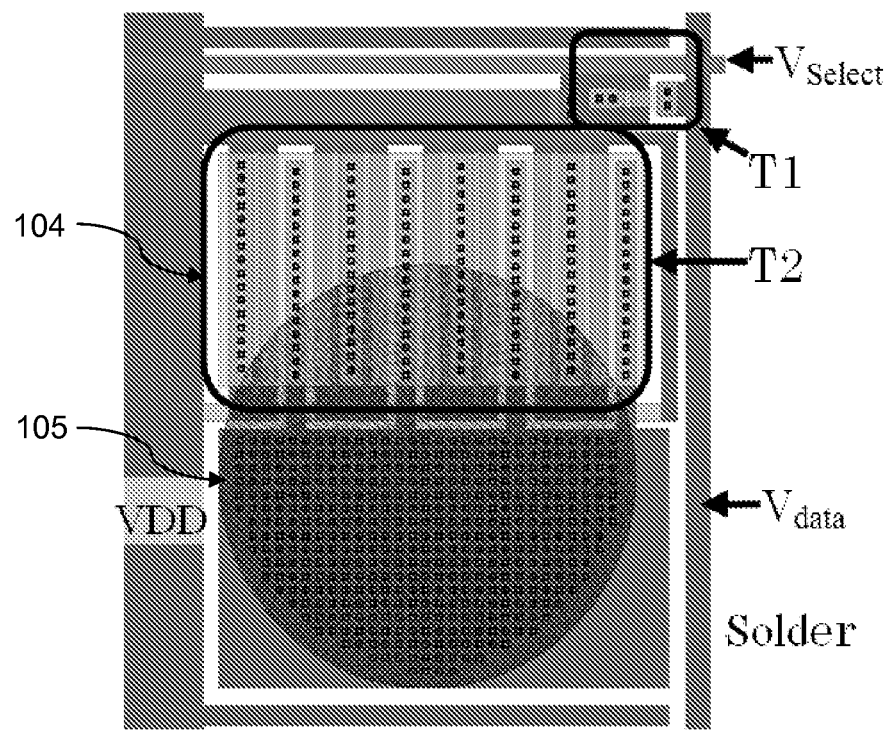
FIG. 10 shows a microscopic image of an assembled AM LED micro-array panel.
Figure 13:
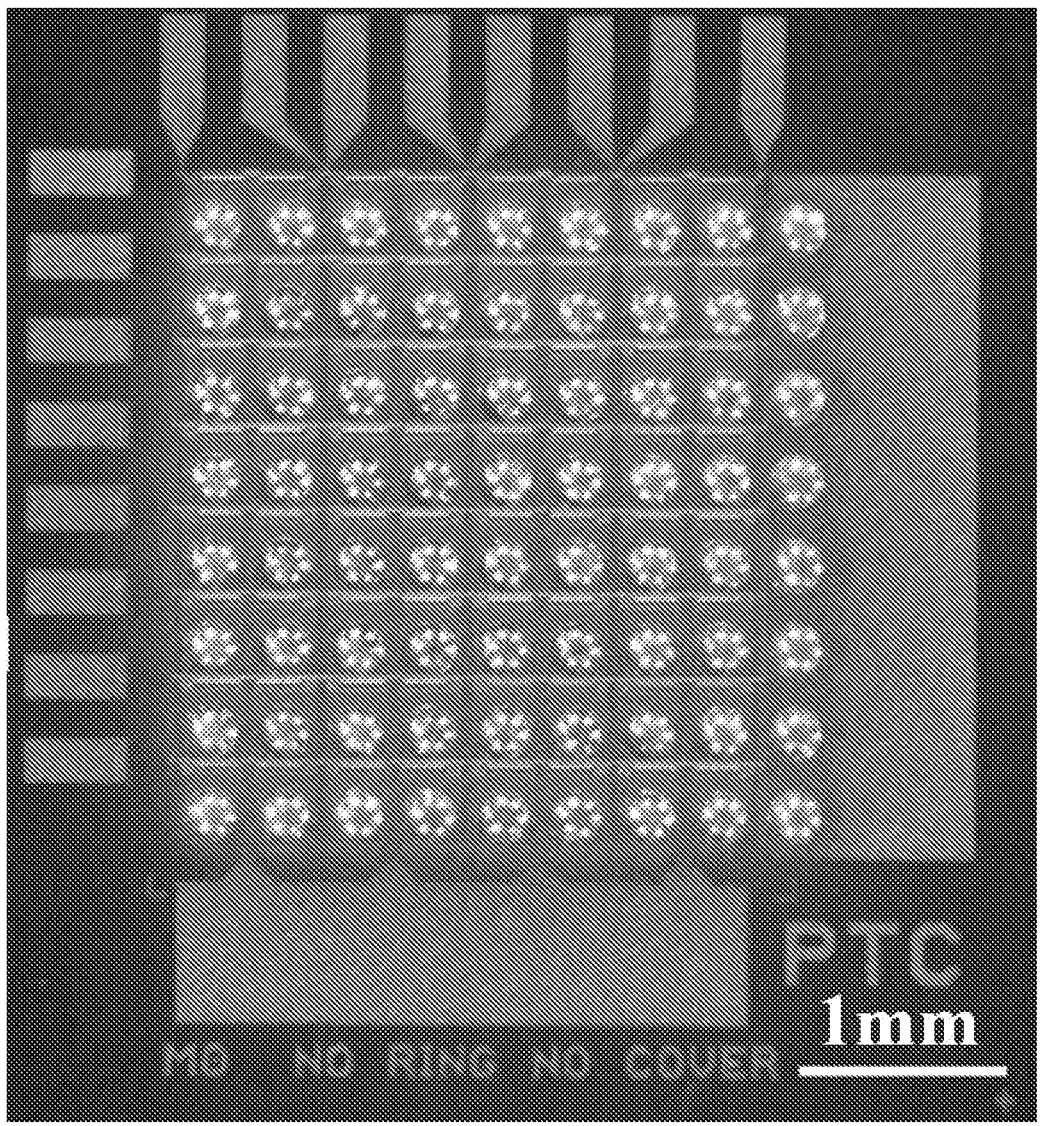
FIG. 13 shows solder bumps on a top of an AM panel.

Thirdly, a flip-chip process of the AM panel and the LED micro-array panel is being described. After the CMOS process, a layer of PECVD $SiO_2$ was deposited on the AM panel for passivation and holes were opened. A TiW/Cu (30/500 nm) seed layer was deposited by sputtering and photoresist AZ4903 was coated and patterned by photolithography. A thick Cu layer (8 μm) and solder layer (22 μm) were deposited by electrical plating. After reflow in the annealing furnace, excellent solder bumps were formed in a ball shape, as is shown in FIG. 13. The LED micro-array wafer was thinned and diced. After flipping the diced LED micro-array onto the AM panel, the device is completed as is shown in FIG. 10. The completed device was packaged in a dual in-line package (DIP) 40 socket and electrically connected by wire bonding.

Figure 8:
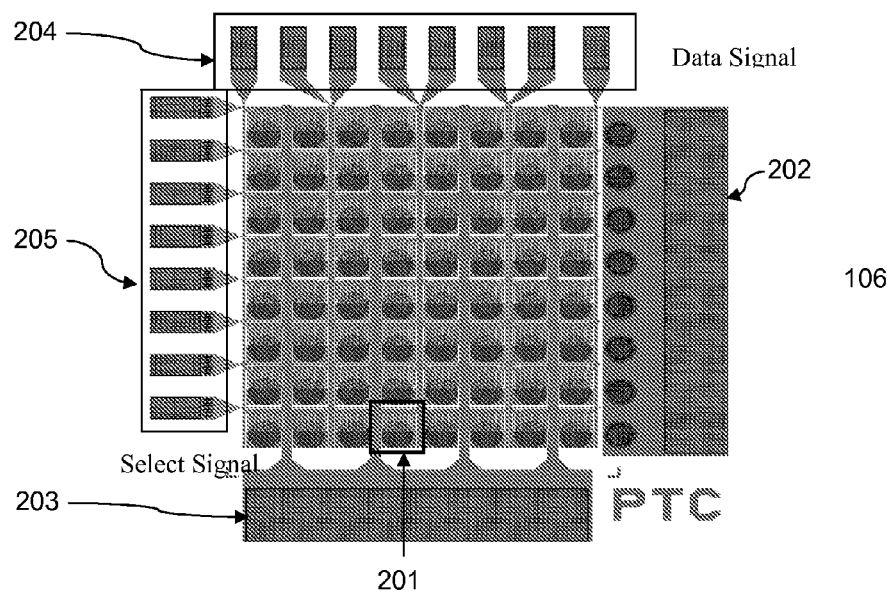
FIG. 8 shows a configuration of 8×8 LED driving circuits on an AM panel according to the present subject matter.

FIG. 8 shows a configuration of 8×8 LED driving circuits on an AM panel according to the present subject matter. The AM panel includes 8×8 pixel driving circuits 201, a power source VDD 202, a ground 203, and inputs for data signals 204 and inputs for select signals 205. The driving circuits 201 are selected from the group consisting of p-channel Metal Oxide Semiconductor (PMOS) transistors; n-channel Metal Oxide Semiconductors (NMOS) transistor; n-type amorphous silicon Thin Film Transistors (n-type a-Si TFTs); p-type amorphous silicon Thin Film Transistors (p-type a-Si TFTs); n-type poly crystalline silicon Thin Film Transistors (n-type p-Si TFTs); p-type poly crystalline silicon Thin Film Transistors (p-type p-Si TFTs); n-type SOI transistors; and/or p-type SOI transistors.

Figure 9:
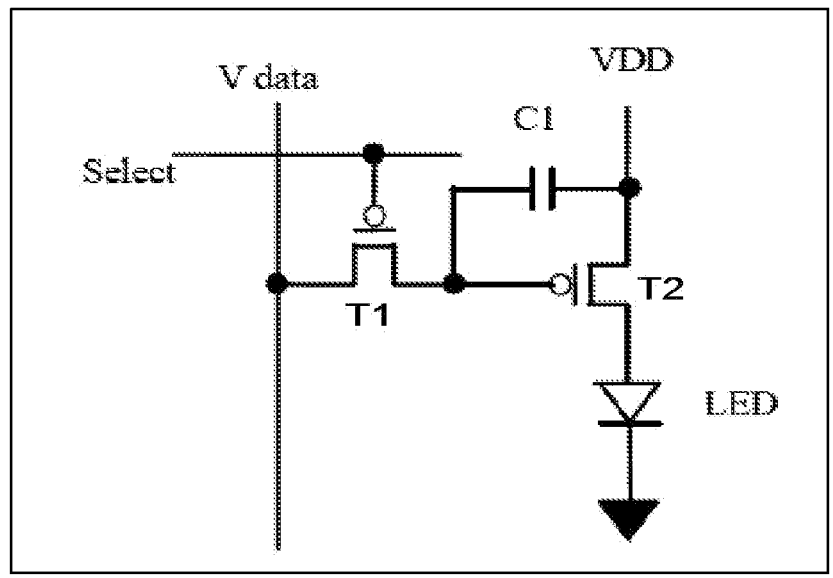
FIG. 9 is a schematic diagram of a pixel driving circuit according to the present subject matter.

FIG. 9 is a schematic diagram of a pixel driving circuit according to the present subject matter. Transistor T1 serves as a switching transistor and transistor T2 serves as a driving transistor. When transistor T1 is switched on by a scan signal, a data signal switches transistor T2 on and is stored in capacitor C1. Then, transistor T2 provides current to turn on the LED pixel whose p-electrode is connected to the drain of transistor T2. Driving transistor T2 is designed with a large W/L ratio to warrant enough current for the LED pixel.

FIG. 10 shows a microscopic image of an assembled AM LED micro-array panel. The LED micro-array 104 is thinned and polished, and then flipped on an AM panel 105. Light is emitted from the backside of the substrate. It is found that the aspect ratio of the AM LED micro-array could be as high as 100%, profiting from bottom emitting configuration.

Figure 11:
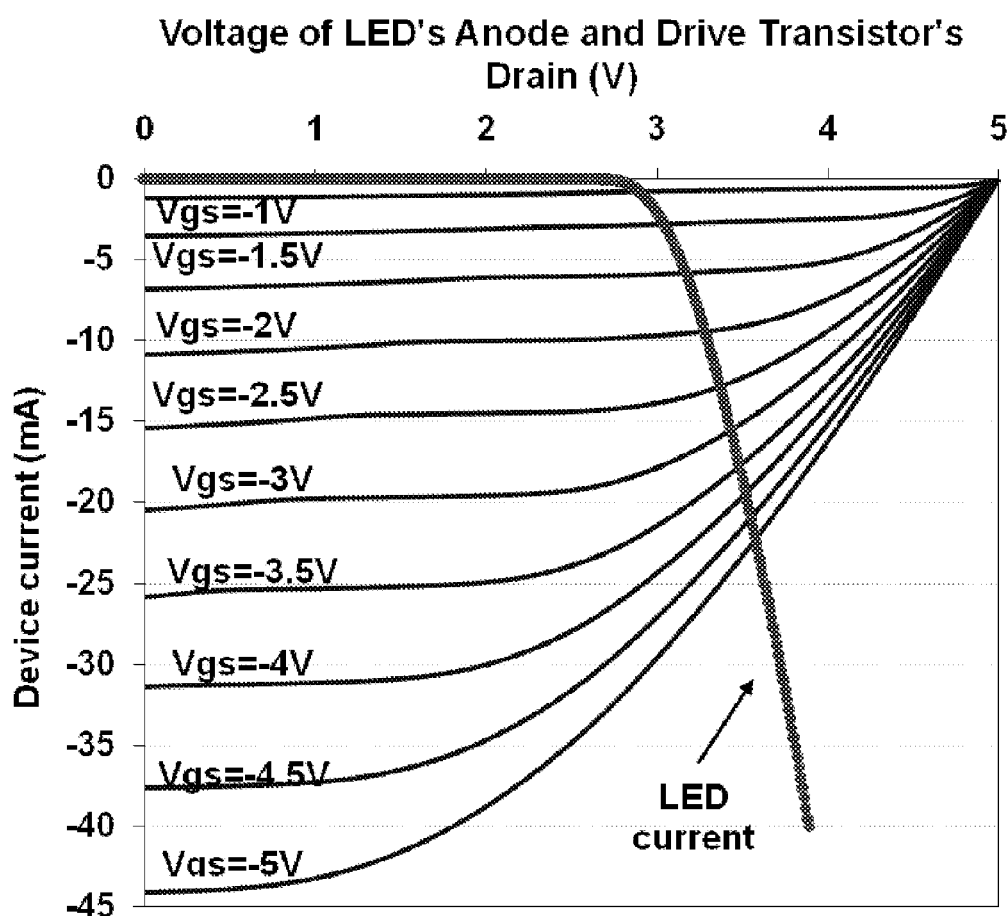
FIG. 11 shows a typical current-voltage (I-V) characteristic of an individual pixel in an AM LED micro-array panel.

FIG. 11 shows a typical current-voltage (I-V) characteristic of an individual pixel in an AM LED micro-array panel. Since the LED and the driving transistor are connected in series, the operating points are determined by the power supply voltage as well as the current-voltage characteristics of the LED and the driving transistor. From the I-V curve, it is shown that the AM panel has sufficient driving capability for the LED micro-array.

Figure 12A:
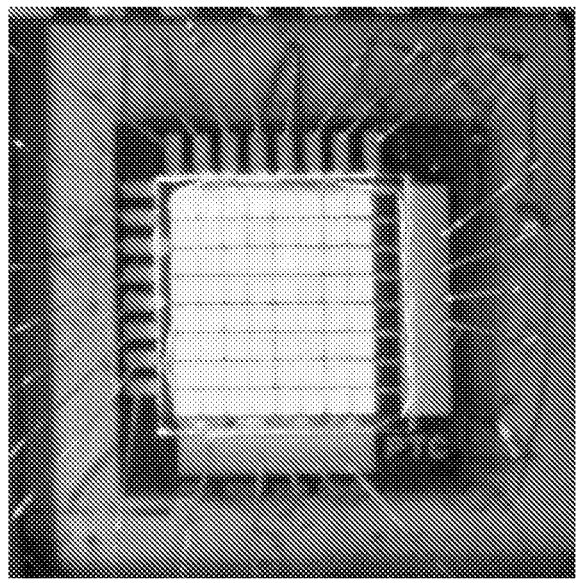
FIG. 12A and FIG. 12B respectively show fully turned-on and individually turned-on images of an AM LED micro-array panel.
Figure 12B:
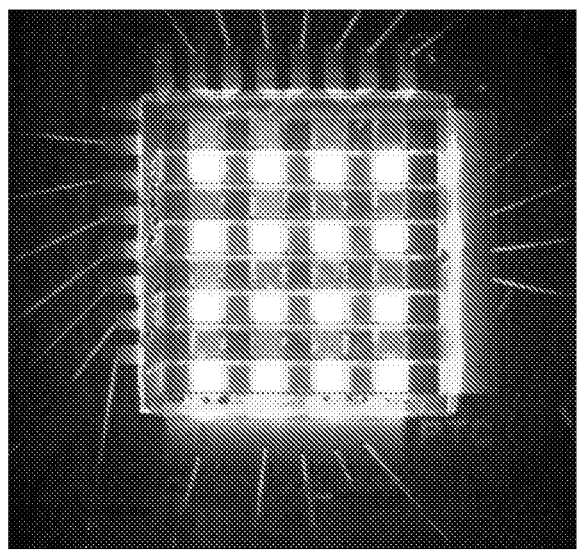

FIG. 12A and FIG. 12B respectively show fully turned-on and individually turned-on images of an AM LED micro-array panel according to the present subject matter. The LED pixels have high brightness, good luminance uniformity and individual controllability by the AM panel. FIG. 13 shows an AM panel on which a plurality of solder bumps are attached in rows and columns.

According to the constitutions described above, individual controllability of each LED pixel in the LED micro-array as well as prevention of cross-talk between neighboring LED pixels is achieved. In addition, the present subject matter provides good luminance uniformity and high drive capability across a large area by driving each LED pixel with an individual pixel circuit, as well as ensuring a small LED pixel pitch and high display resolution. Also, by this constitution, interconnection lines between an output of the AM panel and a p-electrode of the LED pixels is saved. The present subject matter overcomes the incompatibility between the LED process and the CMOS process.

Although the subject matter has been described with reference to the illustrated embodiment, the subject matter is not limited thereto. Rather, it will be obvious that the same may be varied in many ways. Such variations are not to be regarded as a departure from the spirit and scope of the subject matter, and all such modifications as would be obvious to one skilled in the art are intended to be included within the scope of the following claims.

What is claimed is:

1. A method for manufacturing a monolithic Light Emitting Diode (LED) micro-display panel on an Active Matrix (AM) panel, comprising:
   providing a substrate of the LED micro-display panel;
   overlaying a plurality of layers of material on a surface of the substrate, the plurality of overlaying layers of material being configured in combination to emit light when activated;
   patterning the plurality of overlaying layers of material by removing a part of each overlaying layers all the way down to the surface of the substrate;

depositing a current spreading layer on the patterned plurality of overlaying layers of material and surface of the substrate;

providing a metal multilayer on the current spreading layer;

patterning the metal multilayer in such a configuration that a first portion of the metal multilayer, which lies on the patterned plurality of overlaying layers of material, and a second portion of the metal multilayer, which lies on the surface of the substrate are conductively disconnected, thereby forming the monolithic LED micro-display panel; and combining the monolithic LED micro-display panel with the AM panel, said AM panel comprising a plurality of active control circuit chips with conductive solder material, said combining comprising flip-chip bonding the monolithic LEDs to the active control circuit chips via the conductive solder material, wherein each of the monolithic LEDs is electrically insulated from one another and independently controllable by corresponding ones of the active control circuit chips bonded thereto.

2. The method according to claim 1, wherein the substrate of the LED micro-display panel comprises at least one material selected from the group consisting of: GaAs, SiC, Semi-insulating GaAs, Sapphire, and Quartz.

3. The method according to claim 1, wherein the plurality of overlaying layers of material include a p-GaN layer, a Multiple Quantum Well (MQW) layer, and n-GaN layer.

4. The method according to claim 1, wherein the current spreading layer forms p-electrodes of the LEDs, and the metal multilayer forms n-electrodes of the LEDs and reflective layers on the p-electronics, and wherein the array of the multiple LEDs are arranged in rows, the method further comprising:

connecting the n-electrodes of LEDs in a same row to a common N-bus line that is connected to a ground of the AM panel; and connecting the p-electrodes of the multiple LEDs individually to outputs of corresponding active control circuit chips on which the multiple LEDs are flip-chip bonded.

5. The method according to claim 1, wherein the patterning the plurality of overlaying layers of material is performed by Inductively Coupled Plasma (ICP) etching using Plasma-Enhanced Chemical Vapor Deposition (PECVD) grown SiO2 masks.

6. The method according to claim 1, wherein each of the multiple monolithic LEDs has a mesa structure with a size equal to or less than 300×300 μm2.

7. The method according to claim 1, wherein the current spreading layer is a thin layer comprising at least one layer selected from the group consisting of a Ni/Au layer and an Ag/ITO layer.

8. The method according to claim 1, wherein the metal multilayer comprises a Ti/Al/Ti/Au layer.

9. The method according to claim 1, wherein the patterning of the plurality of overlaying layers of material by removing a part thereof all the way down to the surface of the substrate is performed by at least one method selected from the group consisting of wet etching and dry etching.

10. The method according to claim 1, further comprising:
providing a passivation layer on the metal multilayer; and
defining openings in the passivation layer containing contact pads configured for the flip-chip bonding with the conductive solder material of the AM panel.

11. The method according to claim 10, wherein the contact pads contained in the openings defined in the passivation layer comprises Ni/Au.

12. The method according to claim 10, wherein the passivation layer on the metal multilayer comprises at least one selected from the group consisting of: SiO2, SiNx and photoresist.

13. A method for manufacturing an assembly of a monolithic Light Emitting Diode (LED) micro-display panel including a plurality of LEDs thereon and an Active Matrix (AM) panel, comprising:

providing a substrate of the AM panel;

providing active control circuits on the substrate of the AM panel;

providing conductive solder material on the active control circuits;

providing a substrate of the LED micro-display panel comprising a patterned plurality layers of material overlaid on a surface of the substrate of the LED micro-display panel, and having a current spreading layer on the a patterned plurality of layers and on a surface of the substrate of the LED micro-display panel;

providing a metal multilayer on the current spreading layer and patterning the metal multilayer in a configuration that a first portion of the metal multilayer, which lies on the patterned plurality of overlaying layers of material, and a second portion of the metal multilayer, which lies on the surface of the substrate are conductively disconnected, form the LED micro-display panel; and combining the AM panel with the LED micro-display panel comprising monolithic LEDs electrically insulated from one another, and flip-chip bonding the active control circuits to the plurality of monolithic LEDs via the conductive solder material, with the monolithic LEDs independently controllable by the active control circuits.

14. The method according to claim 13, further comprising:
depositing a passivation layer on the AM panel;
defining holes on the passivation layer;
depositing a seed layer by sputtering on the passivation layer;
coating a photoresist on the seed layer; and
patterning the photoresist by photolithography.

15. The method according to claim 13, further comprising providing the active control circuits on the substrate of the AM panel in a Complimentary Metal-Oxide Semiconductor (CMOS) fabrication process.

16. The method according to claim 13, further comprising:
thinning and dicing the LED micro-display panel; and
flipping the diced LED micro-display panel onto the AM panel in such a configuration that each of the plurality of LEDs on the diced LED micro-display panel faces corresponding one of the active control circuits on the AM panel.

17. The method according to claim 13, further comprising forming the conductive solder material in a ball shape after reflow in furnace.

* * * * *